United States Patent [19]
Kuban et al.

[11] Patent Number: 5,517,510
[45] Date of Patent: May 14, 1996

[54] METHOD AND APPARATUS FOR INDICATING UNCORRECTABLE ERRORS TO A TARGET

[75] Inventors: Paul A. Kuban, Plainfield; John P. Monson; Robert D. LoGalbo, both of Bartlett; Donald G. Newberg, Schaumburg, all of Ill.

[73] Assignee: Motorola, Inc., Schaumburg, Ill.

[21] Appl. No.: 382,354

[22] Filed: Jan. 31, 1995

[51] Int. Cl.$^6$ .............................. H04L 1/00; H03M 13/00
[52] U.S. Cl. ......................... 371/37.1; 371/2.1; 371/57.1
[58] Field of Search .................................... 371/2.1, 37.1, 371/57.1

[56] References Cited

PUBLICATIONS

"APCO Project 25 Vocoder Description", Jul. 15, 1993, Section 7.

*Primary Examiner*—Stephen M. Baker
*Attorney, Agent, or Firm*—Christopher P. Moreno

[57] ABSTRACT

An uncorrectable set of input vectors (303), comprising a primary input vector (P) and a secondary set of input vectors (S), is provided at a sender (301). The secondary set of input vectors is error correction encoded and modulated with a predetermined input vector (PIV) to produce a secondary set of modulated vectors (S'). A predetermined codeword (PC) is sent along with the secondary set of modulated vectors to a target (302). At the target, the predetermined codeword is decoded and the resulting decoded predetermined codeword 306 is used to demodulate the secondary set of modulated vectors. As the predetermined codeword is chosen such that, when decoded, it is not identical to the predetermined input vector, the secondary set of demodulated vectors (S") will contain a sufficient number of errors to indicate to the target that the set of input vectors is uncorrectable.

22 Claims, 3 Drawing Sheets

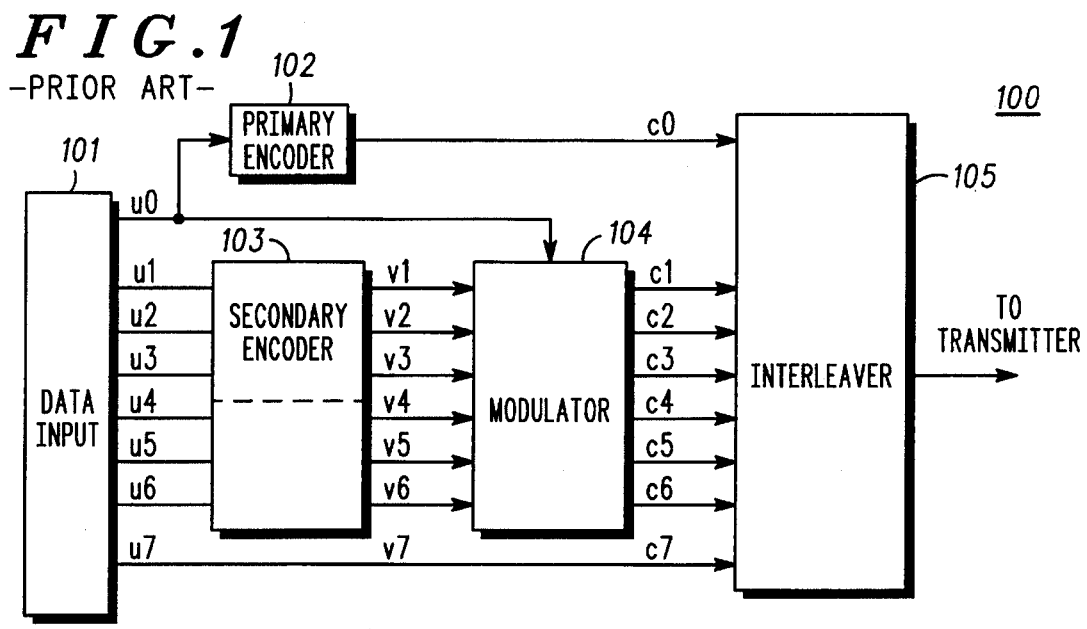
FIG.1 -PRIOR ART-
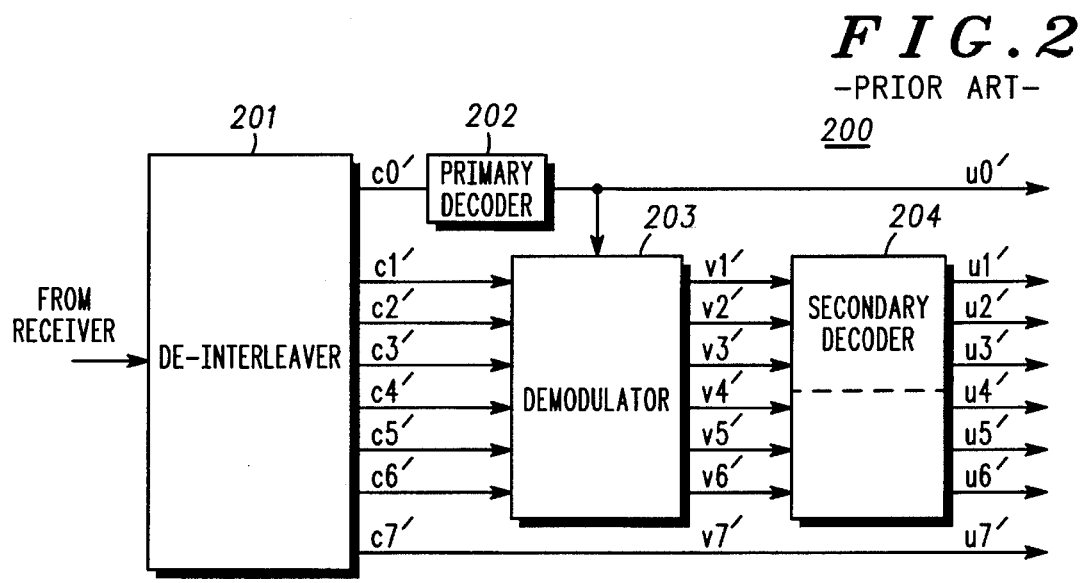
FIG.2 -PRIOR ART-
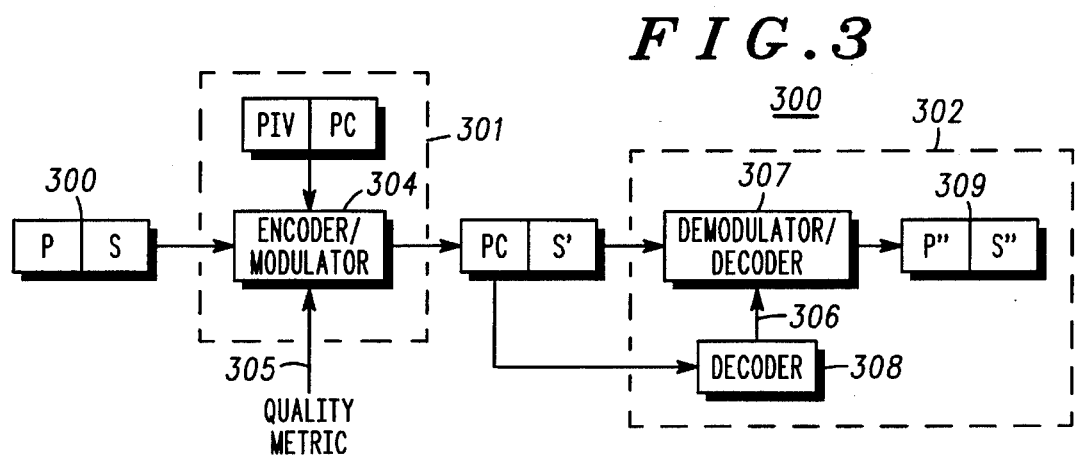
FIG.3

METHOD AND APPARATUS FOR INDICATING UNCORRECTABLE ERRORS TO A TARGET

FIELD OF THE INVENTION

The present invention relates generally to digital communication systems and, in particular, to a method and apparatus for indicating errors to a receiver using forward error correction.

BACKGROUND OF THE INVENTION

Digital communication systems are known to comprise base stations and repeaters in communication with a plurality of communication units. To this end, base stations and repeaters transmit and receive digital voice messages, typically over a radio frequency (RF) communication link. In the case of base stations, messages from consoles may also be transmitted and received over a wireline communication link. Both RF and wireline communication links are known to induce bit errors in transmitted digital voice messages. Indeed, high error rates can be expected over RF links, while significant error rates on wireline links, caused, for example, by switching devices, are also known.

Regardless of the source of error, digital voice messages are typically forward error correction encoded. Forward error correction techniques, often referred to as error correction codes, allow errors to be detected, and even corrected, and can be divided into two categories: perfect codes and non-perfect code, as discussed below. Using these error correction techniques, a message is divided into small portions. Each portion is encoded to produce a codeword, which codewords are transmitted to a target over a given communication link. At the target, the codewords are decoded and most transmission errors induced by the communication link are detected and corrected. The resulting decoded portions may then be processed to reconstruct the original message. The reconstructed message can then be re-encoded for transmission over yet another communication link. This process of repetitive encoding and decoding is continued until the message has reached its final destination.

For example, a message from a console to a communication unit may have to pass through a base station and a repeater before reaching the communication unit. When transmitted over each link (i.e., between the console and base station, base station and repeater, repeater and communication unit), the message undergoes the encoding/decoding procedure described above.

However, error rates on a communication link are often high enough that the error correction technique used is unable to correct all the errors in a particular portion of a message. An uncorrectable portion of a message is typically regarded as unusable. Nevertheless, if synchronization of the message is to be maintained, as is typically the case, a substitute for the uncorrectable portion, typically in the form of a special codeword not otherwise used, indicating the presence of the uncorrectable portion, must be sent to the target of the message. In this manner, the target of the message knows that the portion represented by the special codeword is irreparably corrupted and may execute procedures that mitigate the effect of the uncorrectable portion (error mitigation).

This solution is possible only if codewords exist that would not normally occur as a result of the encoding process, i.e., unused codewords. Error correction codes having unused codewords are often referred to as non-perfect codes. Non-perfect codes can be described as those codes in which a subset of codewords, less than all possible codewords, are valid (i.e., correctable). Conversely, in a perfect code, all possible codewords are valid. Thus, perfect codes used to produce binary codewords consisting of n-information bits would result in $2^n$ valid codewords. Non-perfect codes resulting in binary codewords n-bits in length would have no more than $(2^n-1)$ valid codewords. Therefore perfect codes do not contain unique and valid codewords that could otherwise be used to inform the target of uncorrectable codewords.

Examples of forward error correction encoders and decoders using perfect error correction codes are shown in FIGS. 1 and 2. In particular, the transmitter 100 and receiver 200 are in compliance with standards promulgated by the Associated Public-Safety Communication Officers (APCO), i.e., the so-called APCO-25 Common Air Interface (CAI) standard. A data input device 101 provides a primary input vector u0 and a set of secondary input vectors u1–u7. As shown, the set of input vectors u0–u7 are error correction encoded using a primary 102 and secondary encoder 103. The primary 102 and secondary encoder 103 each implement a perfect code to produce a primary encoded vector cO and a secondary set of encoded vectors v1–v6. A modulator 104 is also provided in which the primary input vector u0 is used to modulate, as known in the art, the secondary set of encoded vectors v1–v6. The resulting secondary set of modulated vectors c1–c6 and the primary encoded vector c0 are then interleaved, as known in the art, by an interleaver 105 prior to transmission. If it is known that any portion of the set of input vectors u0–u7 is irreparably corrupted, the use of perfect codes 102–103 does not allow the transmitter 100 to send an unused codeword, which would otherwise be detectable by the receiver 200, to indicate the corrupted condition.

Reversing the above, the receiver 200 de-interleaves 201 the received data. The received primary encoded vector c0' is decoded by the primary decoder 202, resulting in a received primary input vector u0'. The received secondary set of modulated vectors c1'–c6' are then demodulated by the demodulator 203 based on the received primary input vector u0'. The resulting secondary set of demodulated vectors v1'–v6' is processed through the secondary decoder 204 to produce a received secondary set of input vectors u1'–u7'. Note that if the received primary encoded vector c0' has been corrupted beyond the correction capabilities of the primary decoder 202, demodulation of the received secondary set of modulated vectors c1'–c6' will be corrupted due to errors found in the received primary input vector u0', and the errors then resulting in the received secondary set of input vectors u1'–u6' will be sufficient to induce error mitigation by the receiver 200. Assuming, however, that the received primary input vector u0' has been correctly received, the receiver 200, due to the use of perfect codes, will not induce error mitigation to counter any errors already present in the set of input vectors u0–u7.

One possible solution to this problem is to avoid the need for an indication and to replace the uncorrectable portion with a representation of an audio pattern chosen so as to minimize audio degradation when properly decoded. Message portions representing silence are often used for this purpose. The representations of silence can be chosen such that message synchronization is maintained. However, the use of encryption techniques, as is often the case in digital communication systems, causes representations of silence to be decrypted into representations of random noise, thereby frustrating the attempt to minimize audio degradation.

Still other solutions could be devised in which separate indicators, aside from the codewords themselves, could be transmitted. However, these solutions require additional use of scarce bandwidth resources over the communication links, which is often not feasible. Therefore, a need exists for a method whereby uncorrectable errors occurring in a message, despite the use of a perfect error correction code, can be indicated to the target of the message. Such a method should allow message synchronization to be maintained without the use of additional bandwidth.

BRIEF DESCRIPTION OF THE DRAWINGS

FIG. 1 is a block diagram of a forward error correction encoder in accordance with prior art techniques.

FIG. 2 is a block diagram of a forward error correction decoder that may be used in conjunction with the forward error correction encoder of FIG. 1.

FIG. 3 is a block diagram of a first embodiment of a communication system in accordance with the present invention.

DESCRIPTION OF A PREFERRED EMBODIMENT

Figure 4:
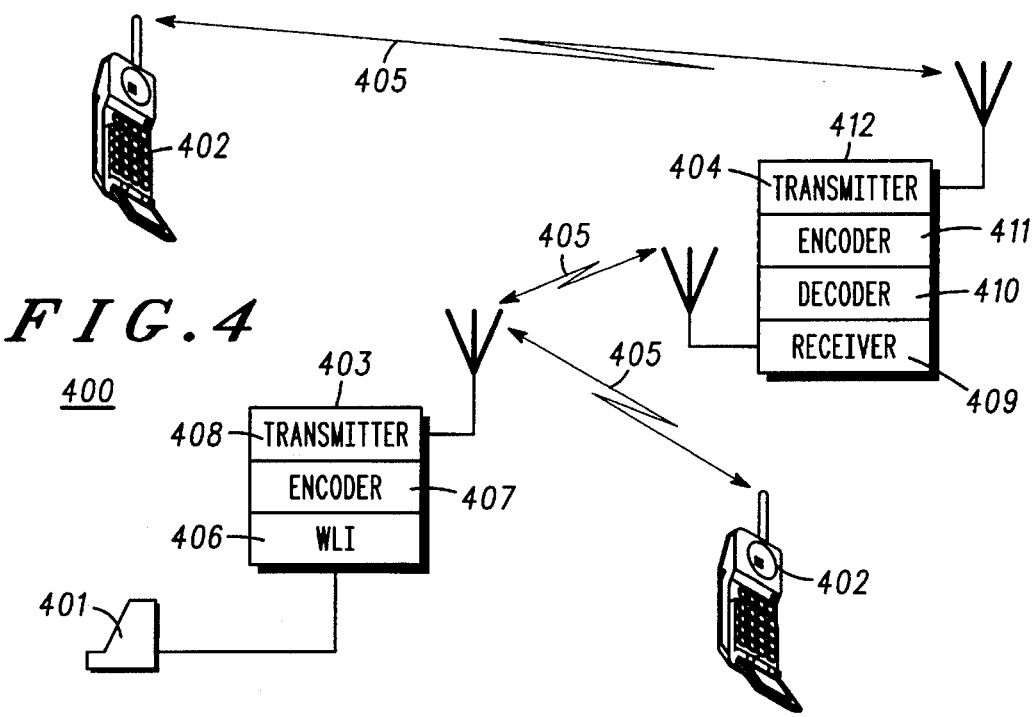
FIG. 4 is a block diagram of a second embodiment of a communication system that may incorporate the present invention.

Generally, the present invention describes a method and apparatus for a sender to indicate the presence of uncorrectable errors to a target. A set of input vectors comprising a primary input vector and a secondary set of input vectors is provided at the sender. The secondary set of input vectors is error correction encoded, and the resulting secondary set of encoded vectors is modulated with a predetermined input vector to produce a secondary set of modulated vectors. A predetermined codeword, equivalent in form to other valid codewords, is sent along with the secondary set of modulated vectors to the target.

Upon receiving the predetermined codeword and the secondary set of modulated vectors, the target decodes the predetermined codeword and the resulting decoded predetermined codeword is used to demodulate the secondary set of modulated vectors. As the predetermined codeword is chosen such that when decoded, it is not identical to the predetermined input vector, the secondary set of demodulated vectors will contain a sufficient number of errors to indicate to the target that the set of input vectors contains errors. In this manner, the presence of uncorrectable errors is made known to the target without affecting the synchronization of the message and without utilizing additional bandwidth.

The present invention can be more fully described with reference to FIGS. 3–6. FIG. 3 illustrates a first embodiment of the present invention. A communication system 300 comprising a sender 301 and a receiver 302 is shown. A set of input vectors 303 comprising a primary input vector and a secondary set of input vectors (P and S, respectively) are provided. The set of input vectors 303 may comprise packets of bits generated by a digital voice compressor, such as an Improved Multiband Excitation (IMBE) speech encoder or a Vector-Sum Excited Linear Prediction (VSELP) speech encoder, as are known in the art. Additionally, it is assumed that the set of input vectors 303 have been previously error correction encoded/decoded to derive the quality metric 305. The quality metric serves to indicate the presence/absence of uncorrectable errors in the set of input vectors 303. In the context of the present invention, an uncorrectable error is assumed to comprise any bit error occurring in the set of input vectors, or any vector derived therefrom, which are beyond the correcting power of the particular error correction code used. Those of average skill in the art will recognize that other methods may be used to establish the quality metric 305, e.g., signal-to-noise ratios and/or received carrier signal strengths.

An encoder/modulator 304 error correction encodes the secondary set of input vectors, using a perfect code, to provide a secondary set of encoded vectors. Also, the primary input vector is encoded using an error correction encoder separate from that used to encode the secondary set of input vectors. It is hereinafter assumed that all error correction codes incorporated in the present invention comprise perfect codes, as defined previously. If the quality metric 305 indicates the presence of at least one uncorrectable error in the set of input vectors 303, the encoder/modulator 304 uses a predetermined input vector (PIV) to modulate the secondary set of encoded vectors. The encoder/modulator 304 modulates the secondary set of encoded vectors using, for example, a pseudo-random bit modulator of the type described in the APCO-25 CAI standard. The resulting secondary set of modulated vectors (S') and a predetermined codeword (PC) are then sent to the target 302.

The predetermined input vector and the predetermined codeword are chosen so as to produce a sufficient number of errors in the decoding process. In particular, the predetermined codeword, when error correction decoded, has a large Hamming distance from the predetermined input vector. Stated another way, the predetermined codeword, when decoded, results in a vector having numerous bit-differences compared to the predetermined input vector.

When the decoder 308 decodes the predetermined codeword, the resulting decoded predetermined codeword 306 will be substantially different, bit-wise, from the predetermined input vector originally used for modulation at the sender 301. Thus, reconstruction of the secondary set of input vectors by the demodulator/decoder 307, using the decoded predetermined codeword 306 to demodulate the secondary set of modulated vectors, causes numerous uncorrectable errors to occur in the reconstructed set of input vectors 309.

Detecting the uncorrectable errors in the reconstructed set of input vectors 309, the demodulator/decoder 307 causes the target 302 to initiate error mitigation procedures, such as substitution of previously received sets of input vectors for the uncorrectable set of input vectors. Alternatively, audio resulting from the uncorrectable set of input vectors can be muted. Regardless, the present invention provides notification of uncorrectable errors to a message's target such that error mitigation procedures are induced. This is a result of ensuring that the target will receive the uncorrectable data in a highly corrupted state. Additionally, by using predetermined codewords in place of "normal" codewords, synchronization of the message is maintained.

FIG. 4 illustrates a second embodiment of the present invention. In particular, a wireless communication system 400, comprising a console 401, a plurality of communication units 402, a base station 403, a repeater 404, and a plurality of wireless communication resources 405, is shown. The communication system 400 can be a conventional or trunked system, and may incorporate encryption/decryption techniques. The plurality of wireless communication resources 405 may comprise an RF channel such as pairs of frequency carriers, time division multiplexed TDM slots, or any other RF transmission medium.

The communication units 402, which can be ASTRO™ portable radios by Motorola, Inc., provide voice and data communications in the form of encoded/modulated digital information, as described above. The communication units 402 are capable of demodulating and decoding a set of encoded input vectors and generating voice or data based on the set of input vectors.

The base station 403, which can be a QUANTAR™ base station by Motorola, Inc., provides an interface from the console 401 to the communication system 400. The console 401 can be a CENTRACOM Series II™ by Motorola, Inc. The base station 403 receives a set of input vectors representing voice or data from a wireline interface 406. An encoder 407 encodes the set of input vectors, creating a set of encoded vectors, which an RF transmitter 408 RF modulates and transmits, via the wireless communication resource 405, to the repeater 404 and communication units 402. Additionally, the encoder 407 determines if the set of input vectors contains any uncorrectable errors and, if so, encodes the set of input vectors similar to the operation of the sender 301 of FIG. 3.

The repeater 404 (for example a QUANTAR™ repeater) is used to extend coverage of the wireless communication system 400. An RF receiver 409 sends the received set of encoded vectors to a decoder 410. The decoder 410 operates in accordance with the target 302 of FIG. 3. If the set of input vectors was encoded using the predetermined input vector and predetermined codeword, as described above, the decoder 410 will cause the repeater 404 to initiate error mitigation. In such an event, the encoder 411, similar in operation to the encoder 407 of the base station 403, can encode a set of substitute vectors in an effort to mitigate the effect of the uncorrectable errors. Alternatively, the encoder 411 can again encode the uncorrectable data using the predetermined input vector and predetermined codeword so as to ensure error mitigation by any communication units 402 that may receive the message. Similar to the RF transmitter 408 in the base station 403, the RF transmitter 412 RF modulates the set of encoded vectors onto the wireless communication resource 405. Operation of the encoders 407, 411 may be described in more detail with reference to FIGS. 5 and 6.

Figure 5:
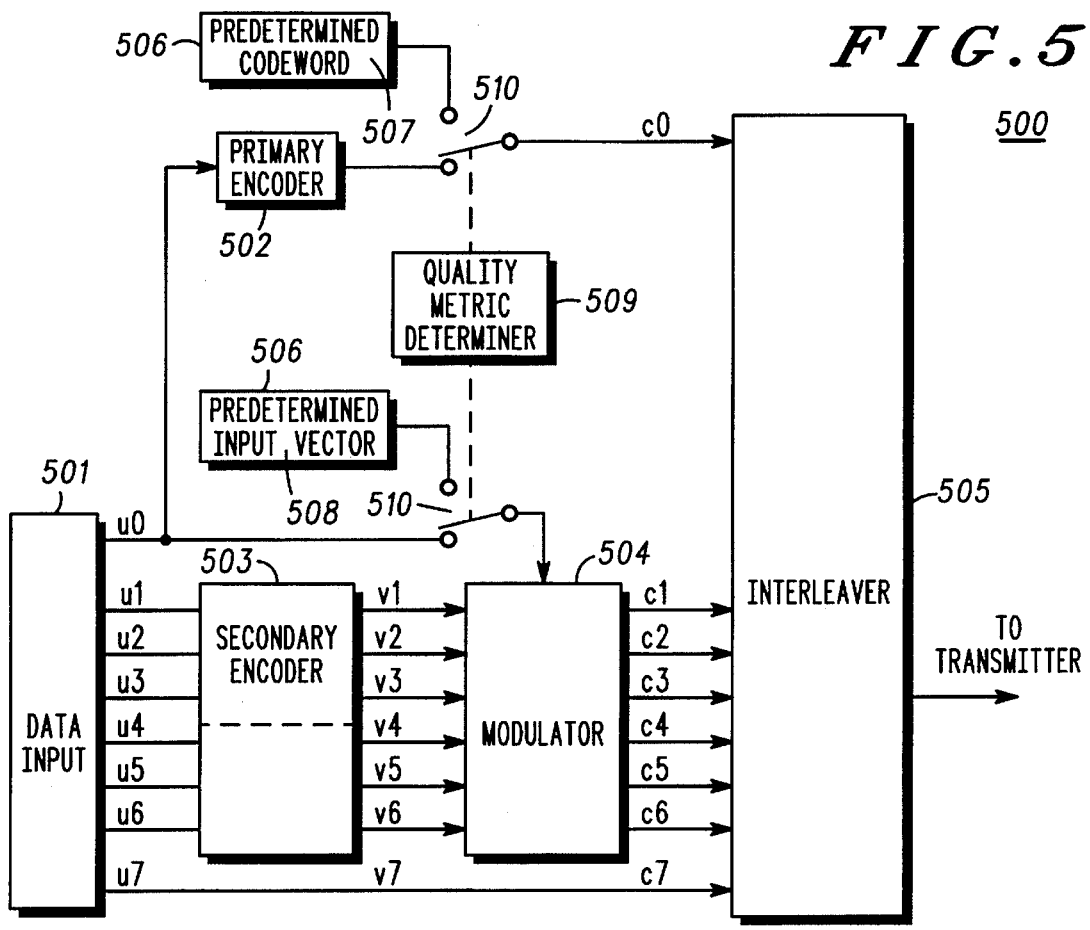
FIG. 5 is a block diagram of a preferred embodiment of the present invention.

FIG. 5 is a block diagram of a forward error correction encoder in accordance with a preferred embodiment of the present invention. Specifically, the forward error correction coder 500 is in accordance with the APCO-25 CAI standard. The forward error correction encoder 500 comprises a data input device 501, a primary error correction encoder 502, at least one secondary error correction encoder 503, a pseudo-random bit modulator 504, a bit interleaver 505, a storage device 506, and a quality metric determiner 509. The storage device 506, which may comprise a non-volatile memory device such as read-only memory, stores at least a predetermined input vector 506 and a predetermined codeword 507. In practice, the primary error correction encoder 502, secondary error correction encoder 503, pseudo-random bit modulator 504, bit interleaver 505, and quality metric determiner 509 can be implemented as software routines stored in the storage device 506 and executed on a microprocessor.

The data input device 501 provides a set of input vectors u0–u7 of voice or data. In the event that the data input device 501 comprises an encryption device, an analogous decryption device is required at the target. Although eight vectors are shown, the present invention can be adopted for any number of input vectors. Assuming that there are no uncorrectable errors in the set of input vectors u0–u7, the primary error correction encoder 502 encodes a primary input vector u0, using a perfect error correction code such as the Golay (23,12) code, to produce a primary encoded vector c0. Similarly, the secondary error correction encoder 503 encodes a secondary set of input vectors u1–u6, using at least one perfect error correction code such as the Golay (23,12) and/or Hamming (15,11) codes, to produce a secondary set of encoded vectors v1–v6.

Again assuming that there are no uncorrectable errors in the set of input vectors u0–u7, the quality metric determiner 509 controls switches 510 so that the primary input vector u0 is routed as a seed vector to the pseudo-random bit modulator 504, as shown in FIG. 5. As known in the art, the pseudo-random bit modulator 504 modulates the secondary set of encoded vectors v1–v6 using the primary input vector u0 as the seed vector. In particular, the pseudo-random bit modulator 504 generates, based on the seed vector, a set of pseudo-random vectors which modulate the secondary set of encoded vectors v1–v6 via a logical operation, such as an exclusive-OR. The resulting secondary set of modulated vectors c1–c6, in addition to the primary encoded vector c0, are bit interleaved by the bit interleaver 505. The resulting interleaved vector is sent to a transmitter, e.g., RF transmitters 403, 412.

The quality metric determiner 509 monitors the set of input vectors for errors and makes a decision about their integrity. For example, a cyclic redundancy code (CRC), as known in the art, can be used. At the original source of the set of input vectors, e.g., a dispatch console, CRC encoding can be performed. Although not shown taking the set of input vectors u0–u7 as input in FIG. 5, the quality metric determiner 509 can decode the CRC code to determine if the set of input vectors u0–u7 has been irreparably corrupted.

If it is determined by the quality metric determiner 509 that the set of input vectors u0–u7 is unusable, the quality metric determiner 509 controls the switches 510 so that the predetermined codeword 507 is substituted for the primary encoded vector c0, and that the predetermined input vector 508 serves as the seed vector for the pseudo-random bit modulator 504. The predetermined codeword 507 and the predetermined input vector 508 are chosen to produce enough errors in the decoding process such that error mitigation procedures are induced in the receiver. For example, assuming use of a Golay (23,12) code for the primary encoder 502, the predetermined codeword 507 may comprise 070000 (hexadecimal) and the predetermined input vector may comprise 070 (hexadecimal). As used in the present invention, such values have been shown to cause a number of decoder bit errors approximately equivalent to a communication link having a 50% bit error rate. Such a bit error rate essentially guarantees that error mitigation will be induced.

Figure 6:
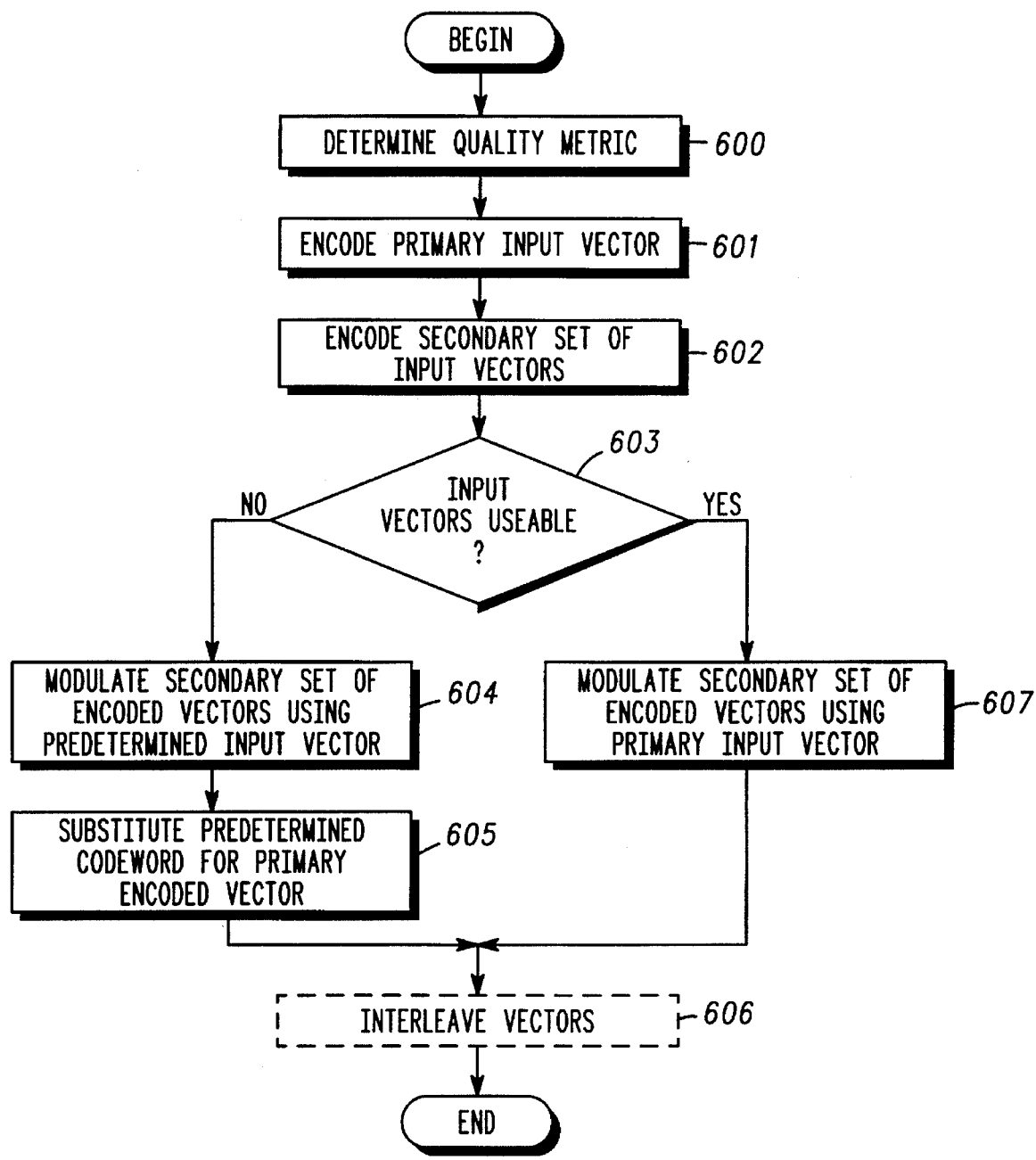
FIG. 6 is a flow chart which describes operation of the preferred embodiment of FIG. 5.

FIG. 6 illustrates a method of forward error correction in accordance with the preferred embodiment. At step 600, the set of input vectors u0–u7 is examined by the quality metric determiner 509 to derive a quality metric. The quality metric comprises a binary indication whether the set of input vectors u0–u7 contains any uncorrectable errors. For example, if a CRC is used to implement the quality metric determiner 509, the quality metric will indicate uncorrectable errors when the CRC does not match the expected value.

Notwithstanding the determination of the quality metric, the primary input vector u0 is encoded using the primary error correction encoder 502 at step 601. Additionally, at step 602, the secondary set of input vectors u1–u6 is encoded by the secondary error correction encoder 503. In the preferred embodiment, the secondary error correction encoder 503 comprises a Golay (23,12) encoder for the first three vectors u1–u3 and a Hamming (15,11) encoder for the remaining three vectors u4–u6. The use of two different encoders provides a method for applying a greater level of protection to the most important vectors in the set.

At step 603, the quality metric derived at step 600 is checked to determine if the set of input vectors u0–u7 is usable, i.e., does not contain uncorrectable errors. If the set of input vectors u0–u7 is usable, step 607 is performed.

At step 607, the secondary set of input vectors u1–u6 is modulated with pseudo random data using the primary input vector u0 as the seed vector for the pseudo-random bit modulator 504. At step 606, the primary encoded vector c0 and the secondary set of modulated vectors c1–c6 are optionally interleaved by the vector interleaver 606.

If, at step 603, the vectors are determined to be unusable, alternate actions are taken beginning with step 604. At step 604, the secondary set of input vectors u1–u6 is modulated with pseudo random data using the predetermined input vector 506 as the seed for the pseudo-random bit modulator 504. This will result in distributing the intentional errors in the predetermined input vector to the remaining vectors. Additionally, at step 605, the predetermined codeword 507 is substituted for the primary encoded vector c0. As described above, the predetermined codeword 507 and the predetermined input vector 506 will cause a large number of errors to occur in the remaining vectors, ultimately resulting in the performance of error mitigation procedures at the target. Finally, at step 606, the predetermined codeword 507 and the secondary set of modulated vectors c1–c6 are optionally interleaved by the vector interleaver 606.

The present invention describes a method and apparatus for a sender to indicate the presence of uncorrectable errors to a target despite the use of a perfect error correction code. Prior art systems using non-perfect codes rely on unique, unused codewords to signal an irreparably corrupted message. Using a predetermined codeword and a predetermined input vector, as described above, the present invention substantially guarantees that the presence of uncorrectable errors will be detected at the target, thereby ensuring the use of error mitigation procedures. In this manner, the present invention preserves message synchronization while not requiring additional bandwidth.

We claim:

1. In a communication system comprising a sender and a target, the sender sending at least a set of input vectors to the target, the set of input vectors comprising a primary input vector and a secondary set of input vectors, wherein the sender detects errors in the set of input vectors, a method for the sender to indicate to the target that the set of input vectors contains errors, the method comprising the steps of:

a) encoding the secondary set of input vectors to produce a secondary set of encoded vectors;

b) modulating, by the sender, the secondary set of encoded vectors with a predetermined input vector to produce a secondary set of modulated vectors;

c) sending, by the sender, the secondary set of modulated vectors and a predetermined codeword to the target;

d) upon receiving the secondary set of modulated vectors and the predetermined codeword, decoding the predetermined codeword to produce a decoded predetermined codeword; and e) demodulating, by the target, the secondary set of modulated vectors using the decoded predetermined codeword to produce a secondary set of demodulated vectors, the secondary set of demodulated vectors having a sufficient number of errors to indicate to the target that the set of input vectors contains errors.

2. The method of claim 1, further comprising the steps of:

f) decoding the secondary set of demodulated vectors to produce a secondary set of decoded vectors; and g) when it is determined that secondary set of decoded vectors contains uncorrectable errors, initiating error mitigation procedures.

3. The method of claim 1, step (a) further comprising the step of encoding the secondary set of input vectors using at least one perfect error correction code.

4. The method of claim 3, step (a) further comprising the step of encoding the secondary set of input vectors using at least one perfect error correction code, the at least one perfect error correction code comprising a (23,12) Golay code.

5. The method of claim 4, step (a) further comprising the step of encoding the secondary set of input vectors using at least one perfect error correction code, the at least one perfect error correction code comprising a (15,11) Hamming code.

6. The method of claim 5, step (c) further comprising the step of sending the secondary set of modulated vectors and the predetermined codeword to the target, wherein the predetermined codeword, when decoded, is not identical to the predetermined input vector.

7. In a forward error correction encoder comprising a primary error correction encoder, at least one secondary error correction encoder, a pseudo-random bit modulator operably coupled to the at least one secondary error correction encoder, a storage device operably coupled to the pseudo-random bit modulator, and a quality metric determiner operably coupled to the storage device, a method for forward-error correction encoding a set of input vectors that includes a primary input vector and a secondary set of input vectors, the method comprising the steps of:

a) determining, by the quality metric determiner, a quality metric of the set of input vectors;

b) encoding, by the primary error correction encoder, the primary input vector to produce a primary encoded vector;

c) encoding, by the at least one secondary error correction encoder, the secondary set of input vectors to produce a secondary set of encoded vectors;

d) when the quality metric indicates that the set of input vectors is not usable, modulating, by the pseudo-random bit modulator, the secondary set of encoded vectors based on a predetermined input vector stored in the storage device; and e) when the quality metric indicates that the set of input vectors is not usable, substituting a predetermined codeword, stored in the storage device, for the primary encoded vector.

8. The method of claim 7, further comprising the step of:

f) when the quality metric indicates that the set of input vectors is usable, modulating, by the pseudo-random bit modulator, the secondary set of encoded vectors based on the primary input vector.

9. The method of claim 7, step (a) further comprising the step of determining the quality metric by decoding a cyclic redundancy code (CRC) for the set of input vectors.

10. The method of claim 7, step (b) further comprising the step of encoding the primary input vector using a (23,12) Golay encoder.

11. The method of claim 10, step (c) further comprising the step of encoding the secondary set of input vectors using another (23,12) Golay encoder.

12. The method of claim 11, step (c) further comprising the step of encoding the secondary set of input vectors using a (15,11) Hamming encoder.

13. A forward error correction encoder for encoding a set of input vectors that includes a primary input vector and a secondary set of input vectors, the forward error correction encoder comprising:

- a primary error correction encoder that encodes the primary input vector to produce a primary encoded vector;
- at least one secondary error correction encoder that encodes the secondary set of input vectors to produce a secondary set of encoded vectors;
- a pseudo-random bit modulator, operably connected to the at least one secondary error correction encoder, that modulates the secondary set of encoded vectors based on a seed vector;
- a storage device, operably coupled to the pseudo-random bit modulator, that stores a predetermined codeword and a predetermined input vector; and
- a quality metric determiner, operably coupled to the storage device, that determines a quality metric of the set of input vectors, wherein the seed vector comprises the primary input vector when the quality metric indicates that the set of input vectors is usable, and wherein the seed vector comprises the predetermined input vector and the predetermined codeword is substituted for the primary encoded vector when the quality metric indicates that the set of input vectors is not usable.

14. The forward error correction encoder of claim 13, wherein the predetermined codeword, when decoded, is not identical to the predetermined input vector.

15. The forward error correction encoder of claim 13, wherein the quality metric determiner comprises a cyclic redundancy code (CRC) decoder.

16. The forward error correction encoder of claim 13 further comprising:

- a bit interleaver, operably coupled to the primary error correction encoder, the pseudo-random bit modulator, and the storage device, that interleaves the secondary set of encoded vectors and one of a set that includes the primary encoded vector and the predetermined codeword.

17. The forward error correction encoder of claim 13, wherein the primary error correction encoder and the at least one secondary error correction encoder each comprise a perfect error correction encoder.

18. The forward error correction encoder of claim 17, wherein the primary error correction encoder comprises a (23,12) Golay encoder.

19. The forward error correction encoder of claim 18, wherein the at least one secondary error correction encoder comprises another (23,12) Golay encoder.

20. The forward error correction encoder of claim 19, wherein the at least one secondary error correction encoder further comprises a (15,11) Hamming encoder.

21. A base station comprising:

- a wireline interface for receiving a set of input vectors, the set of input vectors further comprising a primary input vector and a secondary set of input vectors;
- a forward error correction encoder, operably coupled to the wireline interface, for encoding the set of input vectors, the forward error correction encoder comprising:
  - a primary error correction encoder that encodes the primary input vector to produce a primary encoded vector;
  - at least one secondary error correction encoder that encodes the secondary set of input vectors to produce a secondary set of encoded vectors;
  - a pseudo-random bit modulator, operably connected to the at least one secondary error correction encoder, that modulates the secondary set of encoded vectors based on a seed vector;
  - a storage device, operably coupled to the pseudorandom bit modulator, that stores a predetermined codeword and a predetermined input vector;
  - a quality metric determiner, operably coupled to the storage device, that determines a quality metric of the set of input vectors, wherein the seed vector comprises the primary input vector when the quality metric indicates that the set of input vectors is usable, and wherein the predetermined codeword is substituted for the primary encoded vector and the seed vector comprises the predetermined input vector when the quality metric indicates that the set of input vectors is not usable;
  - a bit interleaver, operably coupled to the primary error correction encoder, the pseudo-random bit modulator, and the storage device, that interleaves the secondary set of encoded vectors and one of a set that includes the primary encoded vector and the predetermined codeword to produce interleaved vectors; and
- a radio frequency (RF) transmitter, operably coupled to the forward error correction encoder, for transmitting the interleaved vectors.

22. A repeater comprising:

- a radio frequency (RF) receiver for receiving a set of input vectors, the set of input vectors further comprising a primary input vector and a secondary set of input vectors;
- a forward error correction encoder, operably coupled to the RF receiver, for encoding the set of input vectors, the forward error correction encoder comprising:
  - a primary error correction encoder that encodes the primary input vector to produce a primary encoded vector;
  - at least one secondary error correction encoder that encodes the secondary set of input vectors to produce a secondary set of encoded vectors;
  - a pseudo-random bit modulator, operably connected to the at least one secondary error correction encoder, that modulates the secondary set of encoded vectors based on a seed vector;
  - a storage device, operably coupled to the pseudo-random bit modulator, that stores a predetermined codeword and a predetermined input vector;
  - a quality metric determiner, operably coupled to the storage device, that determines a quality metric of the set of input vectors, wherein the seed vector comprises the primary input vector when the quality metric indicates that the set of input vectors is usable, and wherein the predetermined codeword is substituted for the primary encoded vector and the seed vector comprises the predetermined input vector when the quality metric indicates that the set of input vectors is not usable;
  - a bit interleaver, operably coupled to the primary error correction encoder, the pseudo-random bit modulator, and the storage device, that interleaves the secondary set of encoded vectors and one of a set that includes the primary encoded vector and the predetermined codeword to produce interleaved vectors; and an RF transmitter, operably coupled to the forward error correction encoder, for transmitting the interleaved vectors.

* * * * *